United States Patent [19]
Mori et al.

[11] Patent Number: 5,019,883
[45] Date of Patent: May 28, 1991

[54] INPUT PROTECTIVE APPARATUS OF SEMICONDUCTOR DEVICE

[75] Inventors: Shigeru Mori; Michihiro Yamada; Hideshi Miyatake; Shuji Murakami, all of Hyogo, Japan

[73] Assignee: Mitsubishi Denki Kabushiki Kaisha, Tokyo, Japan

[21] Appl. No.: 443,864

[22] Filed: Nov. 30, 1989

Related U.S. Application Data

[63] Continuation of Ser. No. 148,366, Jan. 25, 1988, abandoned.

[30] Foreign Application Priority Data

Jan. 28, 1987 [JP] Japan ................... 62-19014

[51] Int. Cl.$^5$ ............ H01L 29/06; H01L 27/02; H01L 29/04
[52] U.S. Cl. .................. 357/23.13; 357/41; 357/51; 357/59
[58] Field of Search ............ 357/23.13, 51, 59 F, 357/59 G, 59 I, 41

[56] References Cited

U.S. PATENT DOCUMENTS 4,691,217 9/1987 Ueno et al. .
4,739,438 4/1988 Sato .................. 357/23.13

FOREIGN PATENT DOCUMENTS

| 54-116887 | 9/1979 | Japan | 357/23.13 |
| 54-136278 | 10/1979 | Japan | 357/23.13 |
| 55-98867 | 7/1980 | Japan | 357/23.13 |
| 57-45975 | 3/1982 | Japan | 357/23.13 |
| 57-204167 | 12/1982 | Japan | 357/23.13 |
| 58-12364 | 1/1983 | Japan | 357/23.13 |
| 58-123768 | 7/1983 | Japan | 357/23.13 |
| 60-120569 | 6/1985 | Japan | 357/23.13 |
| 61-73375 | 4/1986 | Japan | 357/23.13 |
| 61-176146 | 8/1986 | Japan | 357/23.13 |
| 62-90960 | 4/1987 | Japan | 357/23.13 |

OTHER PUBLICATIONS

Scott, David B., *ESD Reliability*, 1986 VLSI Symposium, Texas Instruments, May 28-30, 1986.
Electrical Overstress/Electrostatic Discharge Symposium Proceedings: "The Effects of VLSI Scaling on EOS/ESD Failure Threshold", by R. K. Pancholy, 1981, pp. 85-89.
"IBM Technical Disclosure Bulletin", vol. 29, No. 3 (Aug. 1986), pp. 1300 and 1301.
IBM Technical Disclosure Bulletin, vol. 26, No. 4, (Sep. 1983), Bellos et al, "Transistor for Circuit Protection Having Laterally Extended Collector Region Formign Series Resistor Isolating Circuit from High Voltage".

*Primary Examiner*—Jerome Jackson, Jr.
*Assistant Examiner*—Ngan Van Ngo
*Attorney, Agent, or Firm*—Lowe, Price, Leblanc and Becker

[57] ABSTRACT

An input protective apparatus for a semiconductor device (Q3) comprises an MOS transistor (Q4) having a thick gate insulating film formed therein. The MOS transistor (Q4) has one active layer connected to an input terminal (11) through a second resistor element (R2) and connected to a semiconductor device (Q3) to be protected through a first resistor element (R1), and an other active layer connected to a ground terminal. The input protective apparatus is adapted such that a resistance value $R_1$ of a first resistor element (R1) and a resistance value $R_2$ of the second resistor element (R2) satisfy the relation $R_1 > R_2$, and the on-resistance $R_3$ of the MOS transistor (Q4) and the resistance value $R_2$ satisfy the relation $R_3 << R_2$.

19 Claims, 5 Drawing Sheets

FIG. 1
PRIOR ART
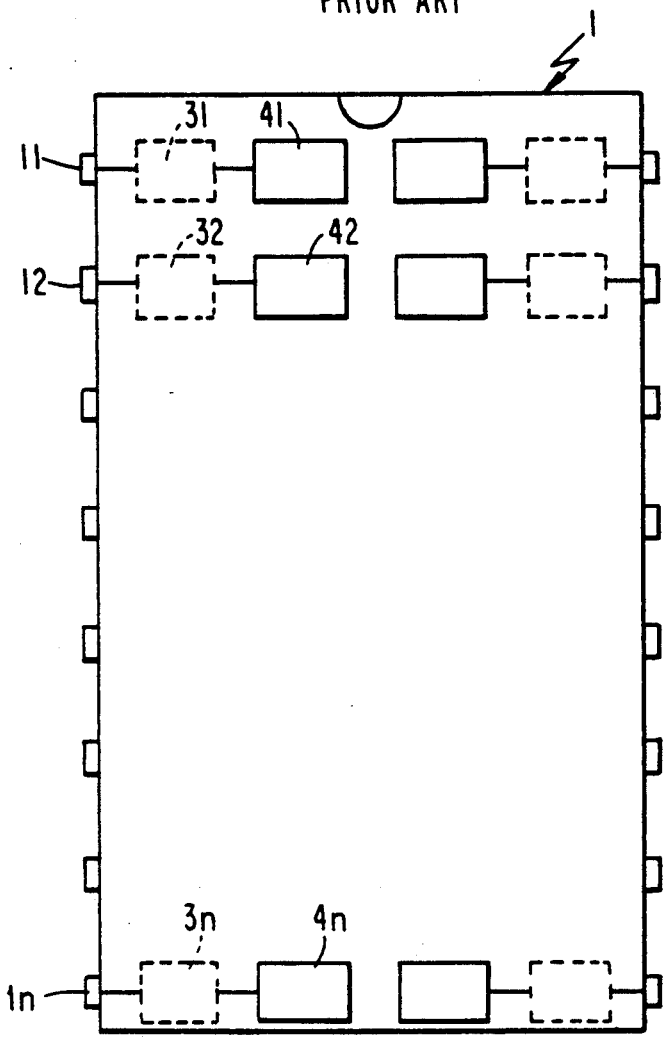
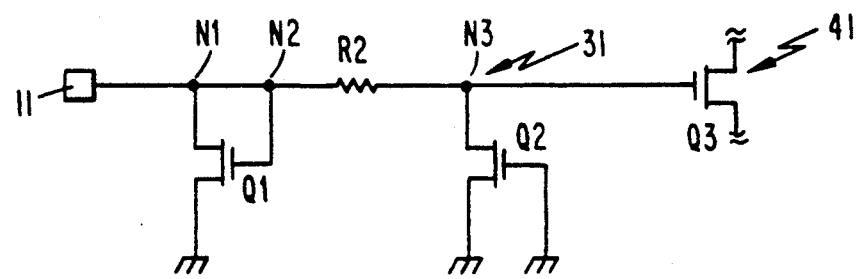
FIG. 2
PRIOR ART

FIG. 8
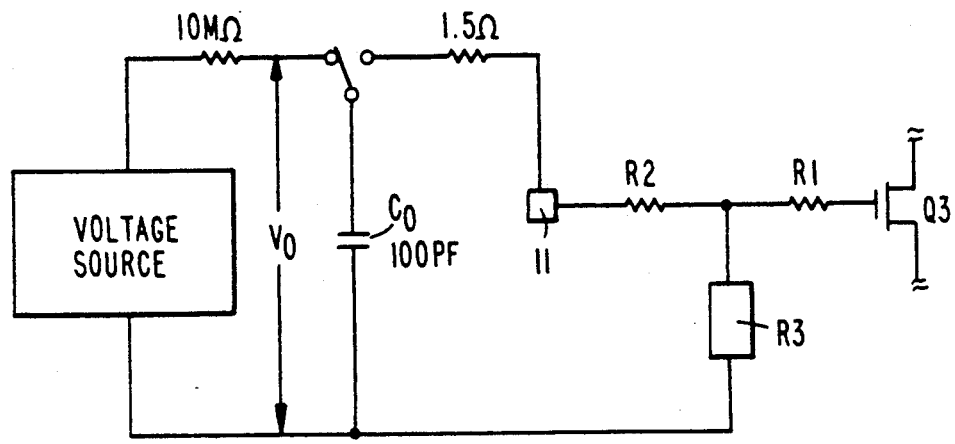
FIG. 9
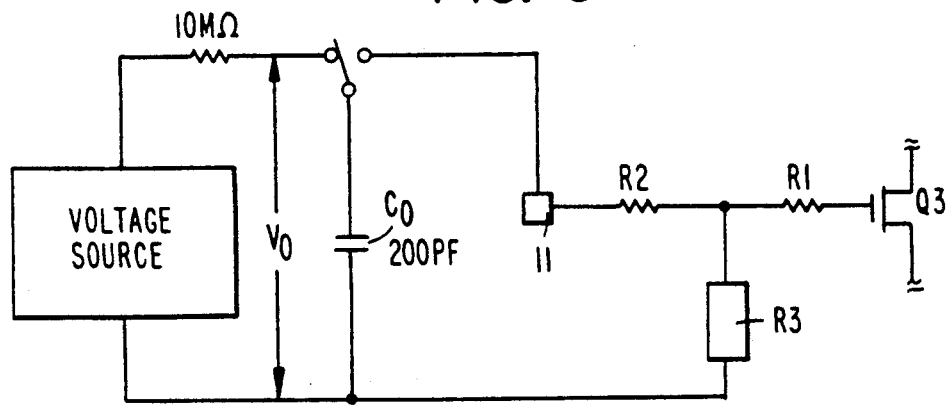
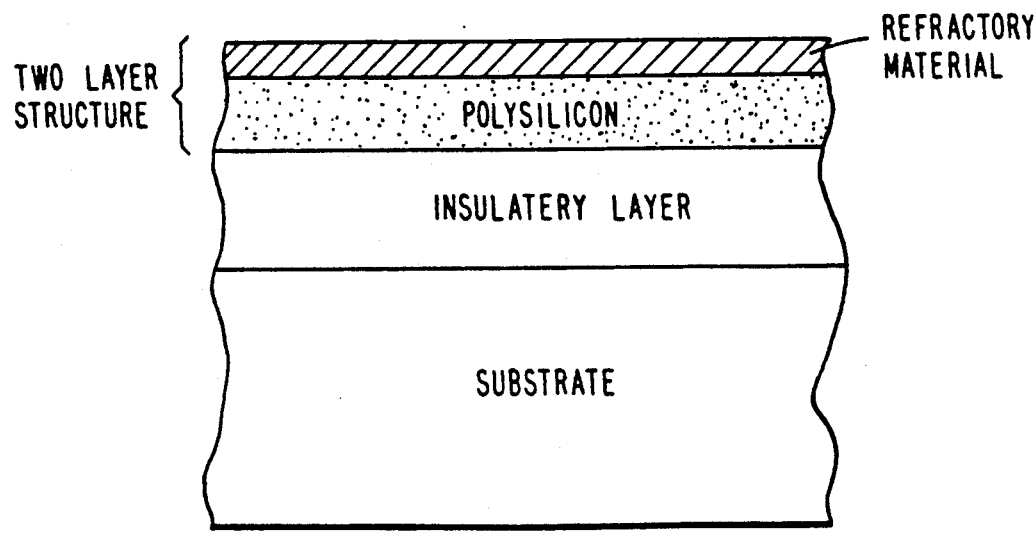
FIG. 11

INPUT PROTECTIVE APPARATUS OF SEMICONDUCTOR DEVICE

This application is a continuation of application Ser. No. 07/148,366, filed Jan. 25, 1988 now abandoned.

BACKGROUND OF THE INVENTION

1. Field of the Invention

The present invention relates generally to an input protective apparatus for a semiconductor device implementing MOS transistors, and more particularly toward protective circuitry capable of protecting input MOS transistors of the device from effects of noise signals having different current and frequency characteristics.

FIG. 1 is a plan view showing a conventional semiconductor integrated circuit having input protective circuits arranged, and FIG. 2 is an electric circuit diagram showing a conventional input protective circuit.

In FIG. 1, a semiconductor integrated circuit 1 is provided with terminals 11 to 1n connected to external circuits. Input protective circuits 31 to 3n are arranged between the terminals 11 to 1n and internal circuits 41 to 4n. As shown in FIG. 2, the input protective circuit 31 comprises an N channel MOS transistor Q1, a resistor element R2 and an N channel MOS transistor Q2. The transistor Q1 has a drain connected to the terminal 11 at a node N1, and a source connected to a ground. In addition, the N channel MOS transistor Q1 has a gate connected to the terminal 11 at a node N2.

Furthermore, one end of the resistor element R2 is connected to the node N2 and the other end thereof is connected to a node N3. The N channel MOS transistor Q2 has a drain connected to the node N3. In addition, an N channel MOS transistor Q3 in the internal circuit 41 to be protected has a gate connected to the node N3. The N channel MOS transistor Q2 has a source and a gate connected to a ground, respectively. The N channel MOS transistor Q1 includes, for example, a so-called field oxide transistor obtained by selectively oxidizing a region between active layers serving as a source and a drain.

FIG. 3 is a diagram showing a cross-sectional structure of the field oxide transistor, and FIG. 4 is a diagram for explaining a punch-through phenomenon in the conventional input protective circuit.

The field oxide transistor shown in FIG. 3 is generally used as the MOS transistor Q1 having a thick gate insulating film shown in FIG. 2. In FIG. 3, active regions 21 and 22 formed of an N+ diffusion layer are formed on a P type semiconductor substrate 28, the active region 21 serving as a source and the active region 22 serving as a drain. In order to separate the active regions 21 and 22, a thick oxide film 23 is selectively formed therebetween. An insulating layer 24 is formed on the oxide film 23 and the active regions 21 and 22. A metal interconnection 25 is formed on the insulating layer 24. In FIG. 3, since an electrode formed of a metal interconnection 26 is formed on the source region which is the active region 21 separated by the thick oxide film 23 and another drain region 29 with the insulating layer 24 interposed therebetween, the field oxide transistor is considered to be a transistor having a very thick gate insulating film in construction. The thick oxide film 23 selectively formed is generally 2000 to 3000 Å in thickness. Thus, when the field oxide transistor operates as a transistor, a threshold voltage $V_{TH}$ thereof is high such as 20 V, so that the field oxide transistor does not operate at normal operating voltage. In addition, the breakdown voltage of the gate insulating film 24 is high, so that the field oxide transistor is suitable for use in the input protective circuit.

However, as shown in FIG. 4, when a surge pulse caused by static electricity is inputted to the terminal 11, the transistor Q1 causes a punch-through phenomenon, so that the static electricity is discharged to a switching terminal. Referring to FIG. 4, the phenomenon is described.

When the surge pulse caused by positive static electricity is applied to the terminal 11, the potential of the source region is higher than that of the P type semiconductor substrate 28. Therefore, electrons in the P type semiconductor substrate 28 are attracted to the source region, so that all of the electrons are emitted, resulting in a depletion layer 27. When the potential of the source region is still higher than that of the P type semiconductor substrate 28, the depletion layer 27 extending from the source region expands and attains the drain region. At this time point, electrons in the drain region are attracted to the source region through the depletion layer 27, so that electrons rapidly flow. This means that current rapidly flows from the source region to the drain region, which is referred to as a punch-through phenomenon. The static pulse applied to the terminal 11 is discharged to a ground terminal, so that charges are not propagated to a transistor Q3. Therefore, the input protective circuit according to the illustrated structure serves as a circuit for protecting the transistor Q3.

Actually, the surge pulse caused by static electricity does not have a single mode but has a number of modes. The input protective circuit must be immune to any mode.

The surge pulse has modes as described in (a) to (c) below.

(a) discharge of a body charging model (body charging method)

The mode, in which static electricity charged in the human body is discharged to the device, is represented by an RC circuit shown in FIG. 8. In this mode, since static electricity is discharged to the device through a resistance of 1.5 KΩ, a large current does not flow. However, large energy is consumed, so that thermal breakdown is liable to occur.

(b) discharge of an apparatus charging model (apparatus charging method)

The mode, in which static electricity charged in a measuring instrument or the like is discharged to the device, is represented by an RC circuit shown in FIGS. 6 and 9. In this mode, since static electricity is discharged to the device not through resistance, a large current flows, so that dielectric breakdown is liable to occur and the current mode is liable to be broken down.

(c) discharge of a package charging model (package charging method)

The mode, in which static electricity charged in a package itself of the device is discharged to the apparatus and the ground terminal through the device, is similar to discharge of the apparatus charging model as described in (b). Energy is smaller, as compared with discharge of the apparatus charging model as described in (b). However, the charging voltage has a higher value, as compared with the case (b), so that dielectric breakdown is liable to occur.

In the input protective circuit shown in FIG. 2, when the transistor Q1 is punched through, impedance from the input terminal 11 to the ground terminal is largely decreased, so that more current flows, as compared with discharge of the apparatus charging model as described in (b) and discharge by the package charging model as described in (c), and the transistor Q1 itself is broken down.

In order to prevent breakdown of the transistor Q1, the size of the transistor must be largely increased.

SUMMARY OF THE INVENTION

A primary object of the present invention is to solve the above described problem and to provide an input protective apparatus having a surge resistance value of more than a constant level with respect to typical three breakdown modes.

Briefly stated, according to the present invention, an MOS transistor has one active layer connected to an input terminal of a semiconductor device through a first and another active layer connected to a ground terminal of the semiconductor device, and a gate formed of a thick oxide film connected to the ground terminal.

Thus, according to the present invention, since a breakdown mode due to a surge pulse caused by static electricity is considered and resistor elements and the MOS transistor are optimized, an input protective apparatus which is uniformly immune to various surge pulses can be formed.

In accordance with a preferred embodiment of the present invention, a second resistor element is connected between an external terminal and one active layer of the MOS transistor, so that a resistance value $R_1$ of the first resistor element, a resistance value $R_2$ of the second resistor element, and on-resistance $R_3$ of the MOS transistor have the relations $R_1 > R_2$ and $R_3 << R_2$.

As described in the foregoing, since parameters of the resistance value $R_1$ of the first resistor element, the resistance value $R_2$ of the second resistor element, and the on-resistance $R_3$ of the MOS transistor are selected, a surge resistance value more than a constant level can be obtained with respect to all of the modes of the surge pulse when the surge pulse caused by static electricity is inputted.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing a conventional semiconductor integrated circuit having input protective circuits arranged;

FIG. 2 is an electric circuit diagram showing a conventional input protective circuit;

FIG. 8 is a circuit diagram showing a body charging method;

FIG. 9 is a circuit diagram showing an apparatus charging method;

FIG. 11 shows a two layer structure of a resistor used in the inventive embodiment.

DESCRIPTION OF THE PREFERRED EMBODIMENTS

Referring now to FIGS. 5 to 10, description is made of an embodiment of the present invention.

Figure 3:
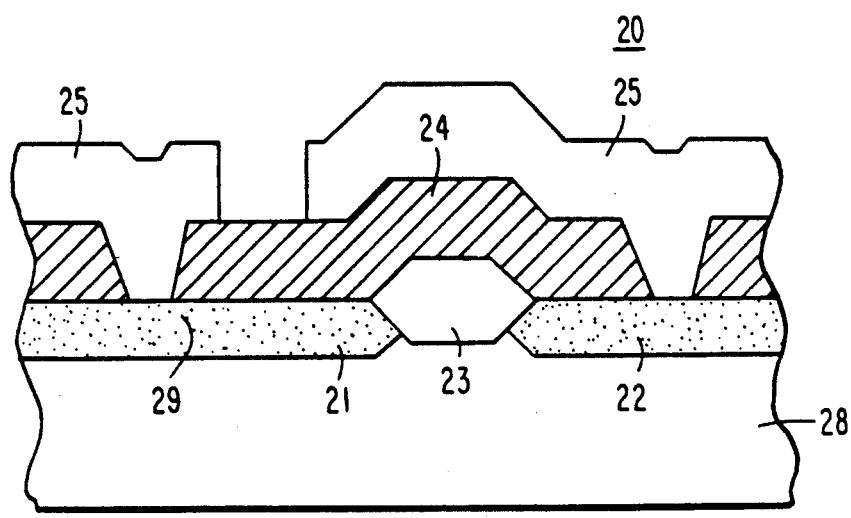
FIG. 3 is a diagram showing a cross-sectional structure of a field oxide transistor forming the input protective circuit.
Figure 4:
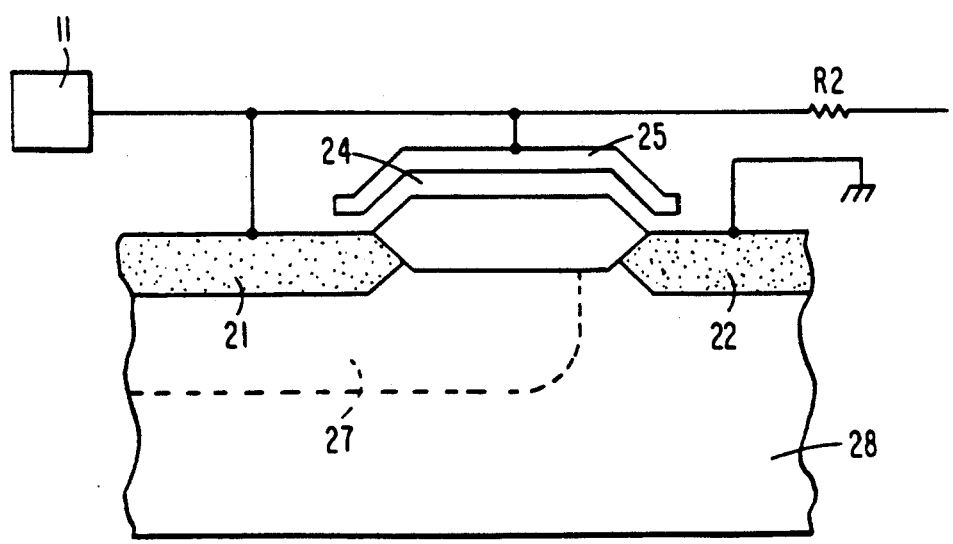
FIG. 4 is a diagram for explaining a punch-through phenomenon in the conventional input protective circuit.
Figure 5:
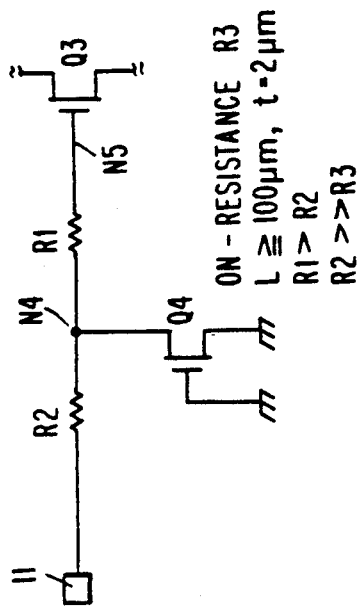
FIG. 5 is a circuit diagram showing an input protective apparatus according to an embodiment of the present invention.

FIG. 5 is a circuit diagram showing an input protective apparatus according to an embodiment of the present invention.

In FIG. 5, an N channel MOS transistor Q4 has a drain electrode connected to one of the two terminals of a first resistor element R1 and to a second resistor element R2 at a node N4. The second resistor element R2 has another terminal connected to the input terminal 11, and the first resistor element R1 has another terminal connected to a node N5. The transistor Q4 has a gate electrode and a source electrode connected to a ground terminal.

The above described transistor Q4 is, for example, a so-called field oxide transistor having a gate oxide film formed by selectively oxidizing a region of a semiconductor substrate between active layers serving as a source and a drain.

In addition, the second resistor element R2 has a resistance value of 30 to 50 $\Omega$, and the first resistor element R1 has a resistance value of several hundreds $\Omega$.

An N channel MOS transistor Q3 in the semiconductor device to be protected has a gate electrode connected to the node N5.

Figure 6:
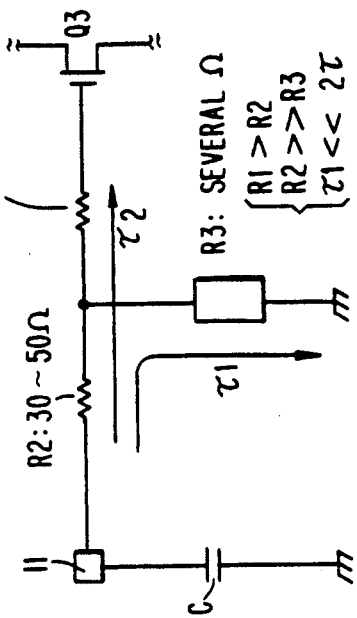
FIG. 6 is a circuit diagram which is equivalent to FIG. 5, at the time of application of a surge pulse.

FIG. 6 is a diagram showing a time constant of discharge and an actual resistance value when a surge pulse caused by static electricity is inputted to the circuit shown in FIG. 5.

Parasitic capacitance C is produced due to the structure of the device and has a capacitance of several pF. When a surge pulse caused by static electricity is inputted to the input terminal 11, the source and the drain of the transistor Q4 shown in FIG. 5 are punched through and the transistor as punched through can be virtually considered to be equivalent to a resistor element R3 having a resistance value of several $\Omega$.

Thus, when the surge pulse caused by static electricity is applied, the circuit shown in FIG. 5 can be considered to be equivalent to the circuit shown in FIG. 6.

Figure 7:
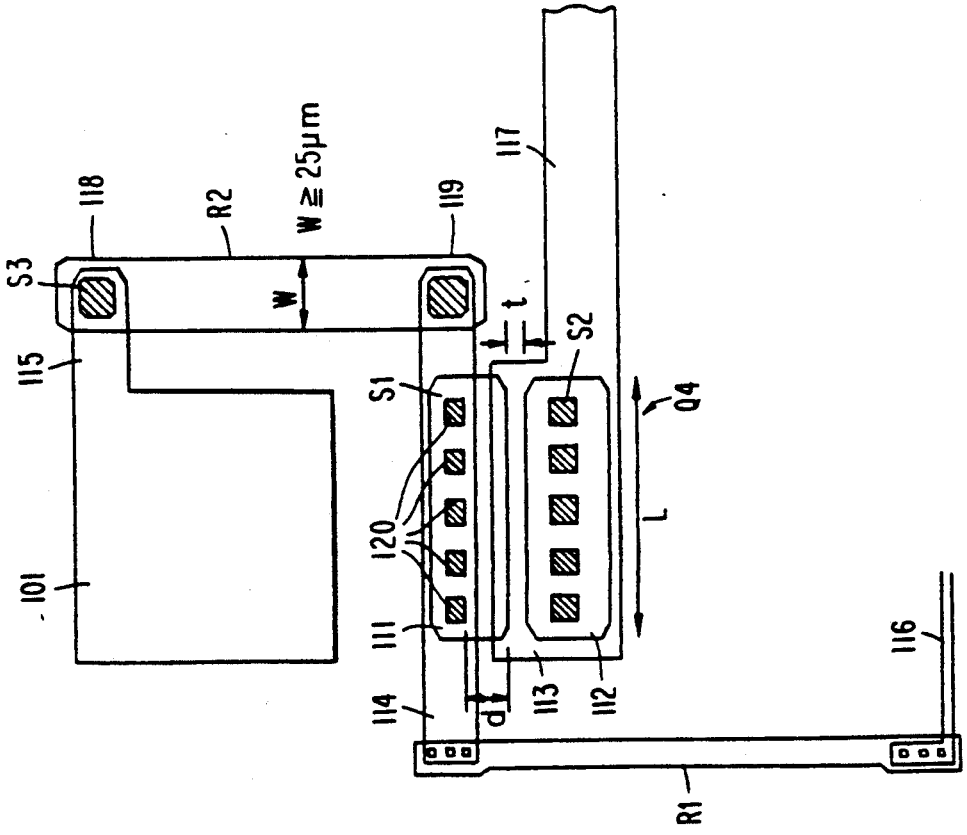
FIG. 7 is a plan view showing an example of a layout of the input protective apparatus shown in FIG. 5.

FIG. 7 is a plan view showing an actual layout of the input protective apparatus shown in FIG. 5.

In FIG. 7, the second resistor element R2 is formed of a film having a two-layer structure comprising polysilicon and a refractory metal, and has a width W more than 25 $\mu$m. If resistance of a sheet having a side of 25 $\mu$m is about 5$\Omega$, the second resistor element R2 becomes a resistor having a resistance value of about 40 $\Omega$ with a length of about 200 $\mu$m.

The first resistor element R1 is formed to have a resistance value of several hundreds $\Omega$ irrespective of the width and the material.

A separated width t between active layers (impurity diffusion layers) 111 and 112 of the transistor Q4 (corresponding to a gate width of an ordinary transistor) is formed to be less than 2 μm and a transistor width L is formed to be more than 100 μm. Particularly, in the active layer 111 serving as a drain region of the transistor Q4, a diffusion area S1 more than 2500 μm² is ensured to prevent breakdown of p-n junction. An interconnection layer 114 for connecting the input terminal 11, a gate electrode 113 and the active layer 111 to the resistor elements R1 and R2, an interconnection layer 115 for connecting the second resistor element R2 to the input terminal 11, an interconnection layer 116 for connecting the first resistor element R1 to the transistor Q3 to be protected, and an interconnection layer 117 for connecting the active layer 112 and the gate electrode 113 to the ground terminal are formed of aluminum.

When the resistor element R2 and the interconnection layer 114 and the resistor element R2 and the interconnection layer 115 are connected to each other, contact portions 118 and 119 having an area of about 250 μm² is ensured in consideration of current density and power density.

In addition, when the active layer 111 and the interconnection layer 114 are connected to each other, a contact portion 120 having an area S2 more than 300 μm² as a whole is ensured in consideration of current density and power density. Furthermore, spacing d between peripheral portions of the contact portion 120 and of the active layer 111 is more than 5 μm.

Description is now made of operation of the input protective apparatus when a surge pulse caused by static electricity is applied to the input terminal 11.

An object of the input protective apparatus is to prevent a high electric field from being applied to a gate insulating film of the transistor Q3 by discharging charges to the ground terminal through the transistor Q4 which is not easily broken down before the electrostatic pulse attains the transistor Q3 within a semiconductor device which is easily broken down. However, there are three modes of the surge pulse, so that the portions which are broken down naturally differ with each mode.

In the input protective apparatus shown in FIG. 2, in the case of the mode of the body charging method as described in (a) above, p-n junction of the first resistor element R2 and the active layer portion is liable to be thermally broken down.

In the mode of the apparatus charging method as described in (b), p-n junction in the active layer portion or the insulating film are liable to be broken down.

In the case of the mode of the package charging method as described in (c), the insulating film is liable to be broken down.

Therefore, in order to hold high breakdown or resistance values with respect to the three modes, the balance of the resistance values, the size of the transistor Q4, the size of the resistor element itself and the like must be optimized. It is assumed herein that the transistor Q4 is formed of a field transistor and the resistor element R2 is formed of a film having a two-layer structure comprising polysilicon and a refractory metal.

In FIG. 8, assuming that the resistor elements R1, R2 and R3 have resistance values $R_1$ of 200 Ω, $R_2$ of 50 Ω and $R_3$ of 2 Ω, respectively, and parasitic capacitance C has a value of 1 pF, a time constant $\tau_1$ when charges are discharged from the input terminal 11 to the ground terminal through the resistor elements R2 and R3 is about 0.05 nsec, and a time constant $\tau_2$ when charges are propagated from the input terminal 11 to the gate electrode of the transistor Q3 through the resistor elements R1 and R2 is 0.25 nsec. Thus, the condition $\tau_1 < < \tau_2$ is satisfied. The surge pulse is discharged to the ground terminal sufficiently faster, as compared with the time when it is propagated to the internal circuit of the semiconductor device, even in consideration of the time period elapsed until the field oxide transistor is punched through, so that the transistor Q3 is protected.

If only a time constant is considered, it is necessary to satisfy the relations $R_1 > R_2$ and $R_3 < < R_2$ ($\tau_1 < < \tau_2$) Practically, the absolute value of resistance also has a significant meaning. As described above, when electrostatic breakdown occurs by the package charging method as shown in (c), the gate oxide film of the transistor Q3 is liable to be broken down. However, electrostatic energy is small, so that a sufficiently large electrostatic breakdown or resistance value is shown by holding the above described resistance value. However, since electrostatic energy is large in the body charging method as described in (a) and the device charging method as described in (b), the size of the transistor must be optimized.

In the body charging method (RC circuit: 1.5 KΩ, 100 pF) shown in FIG. 8, it is assumed that a surge pulse of 3000 [V] is applied (the transistor Q4 is punched through).

In the circuit shown in FIG. 8, it is necessary to solve an equation of discharge of the RC circuit assuming that $V_0=3000[V]$, $R_1=200[\Omega]$, $R_2=50[\Omega]$ and $R_3 = 2[\Omega]$;

$$V = V_0 \cdot e^{-\frac{t}{R_T C_0}} \qquad (1)$$

$$\begin{aligned} I &= -(dQ/dt) \\ &= -C_0 \cdot (dV/dt) \\ &= (V_0/R_T) \cdot e^{-\frac{t}{R_T C_0}} \\ &= (3000/1550) \cdot e^{-\frac{t}{R_T C_0}} \end{aligned} \qquad (2)$$

and thus $I_{max} \approx 2[A]$, wherein, from the Figure, $R_T = 1500 + R_2 + R_3 = 1550[\Omega]$.

In this case, energy $E_1$ absorbed by the resistor element R2 is as follows;

$$\begin{aligned} E_1 &= R_2 \cdot \int_0^\infty I^2 dt \\ &= 50 \cdot (3000/1550)^2 \times \int_0^\infty e^{-\frac{2t}{R_T C_0}} dt \\ &= 14.5 \, [\mu J] \end{aligned} \qquad (3)$$

For example, when the resistor element R2 has a two-layer structure comprising polysilicon and MoSi, the melting point of polysilicon is about 1400° C. and the melting point of MoSi is about 2000° C. Thus, in order to withstand the surge pulse of 3000 [V], a heat capacity of 1 to $2 \times 10^{-9}$ [cal/° C.] is required. When the thickness of the film or the like is measured in an actual process, the size of the resistor element R2 of about 25 μm × 150 μm is required. In addition, even if the resistance value $R_2$ of the second resistor element R2 is increased, the current is not almost changed because it is controlled by resistance of 1.55 kΩ on the side of discharge. Energy absorbed by the second resistor element R2 is proportional to the resistance value $R_2$ of the resistor element R2 as shown in the equation (3). Thus, it is found that the resistance value $R_2$ of the resistor element R2 should not be too large.

Since the relation $R_3 < < R_2$ is satisfied, current flowing to the ground terminal through the resistor element R3 is almost the same as current I in the equation (2);

$$I \simeq (3000/1550) \cdot e^{-\frac{t}{R_TC_0}}$$

On the other hand, since $R_3$ equals 2[Ω], energy $E_3$ absorbed by the resistor element R3 is as follows;

$$E_3 = R_3 \cdot \int_0^\infty I^2 dt = 0.58 [\mu J] \quad (4)$$

Assuming that the time period elapsed until the current value attains 1/e in the initial state by discharge of the RC circuit is a pulse width, the pulse width in the circuit is as follows;

$$\text{pulse width} = 1550 \times 100 \times 10^{-12}$$
$$= 155 \text{ [nsec]}$$

More specifically, energy $W_3$ absorbed by the resistor element R3 per unit time is as follows, $$W_3 = 0.58 \times 10^{-6}/155 \times 10^{-9}$$
$$= 3.74 \text{ [W]}$$

Figure 10:
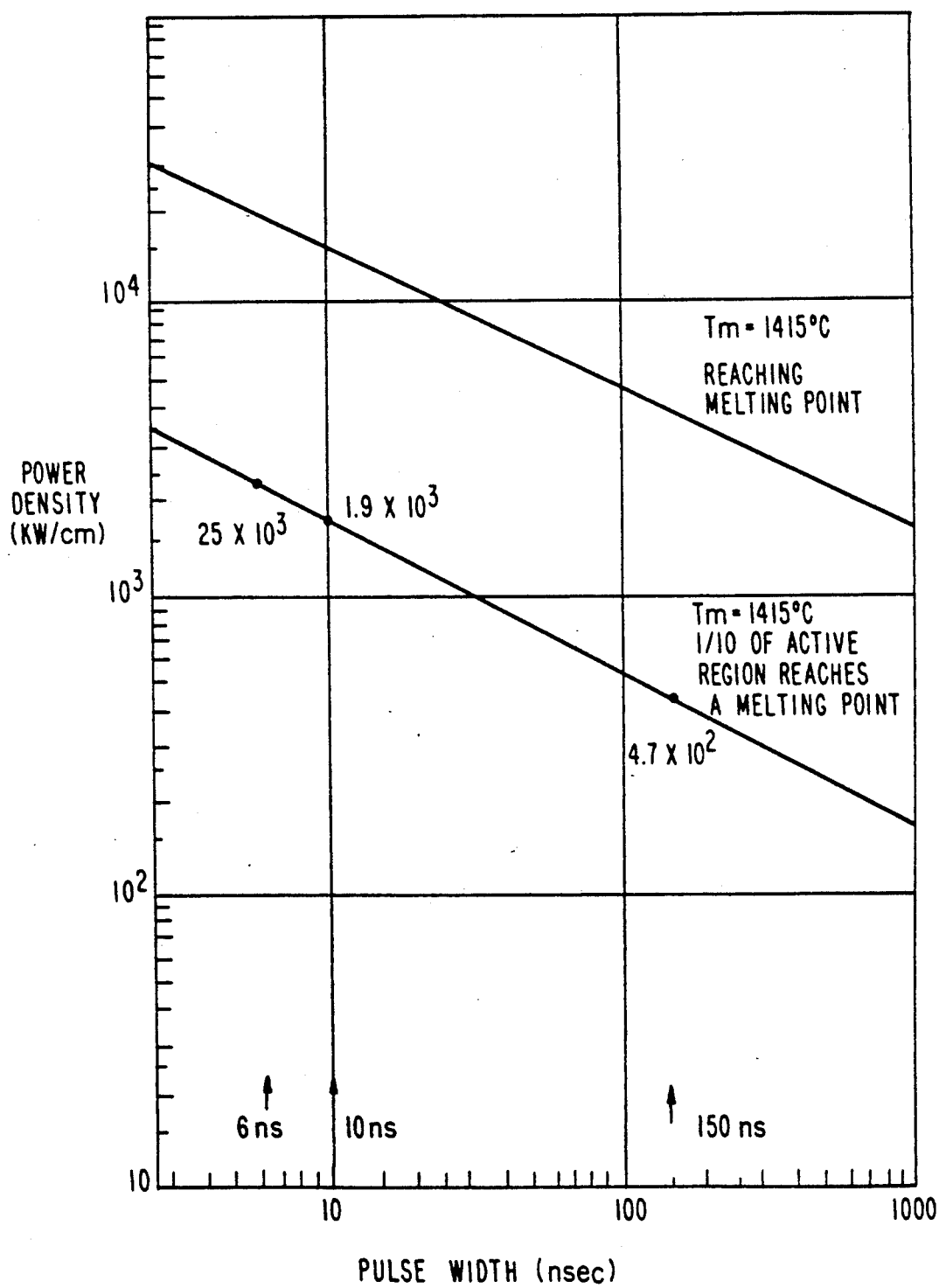
FIG. 10 is a graph showing a relation between a surge pulse width and breakdown power density of p-n junction in a WUNCH BELL model.

FIG. 10 is a graph of power density at the time of breakdown of p-n junction based on the WUNCH BELL model ("The Effect of VLSI Scalling on EQS-/ESD Failure Threshold" Electrical Overstress/Electrostatic Discharge Symposium Proceedings, 1981, pp. 85-89).

In FIG. 10, dangerous power density of junction breakdown is about $5 \times 10^2$ KW/cm² when a pulse width is about 150 nsec. In order to make power density of a diffusion layer less than $5 \times 10^2$ KW/cm², the diffusion area of about 800 μm² is required because the resistor element R3 is a field transistor. Furthermore, in order to make the resistance value $R_3$ of the resistor element R3 about 2 Ω, the contact area is necessarily required and the size of the transistor must be increased because there exists parasitic resistance and contact resistance of the transistor.

In the apparatus charging method (RC circuit: 0Ω, 200 pF) as shown in FIG. 9, it is assumed that a surge pulse of 300 [V] is applied (the transistor Q4 is punched through).

In the circuit shown in FIG. 9, it is necessary to solve an equation of discharge of the RC circuit assuming that $V_0=300$[V], $R_1=200$[Ω], $R_2=50$[Ω], and $R_3 = 2$[Ω];

$$V = V_0 \cdot e^{-\frac{t}{R_TC_0}} \quad (5)$$

$$\begin{aligned} I &= -(dQ/dt) \\ &= -C_0 \cdot (dV/dt) \\ &= (V_0/R_T) \cdot e^{-\frac{t}{R_TC_0}} \\ &= (300/52) \cdot e^{-\frac{t}{R_TC_0}} \end{aligned} \quad (6)$$

And thus, $I_{max} \simeq 6$[A], wherein $R_T=52$[Ω].

In this case, the energy E1 absorbed by the resistor element R2 is as follows;

$$\begin{aligned} E_1 &= R_1 \cdot \int_0^\infty I^2 dt \\ &= 50 \cdot (300/52)^2 \cdot \int_0^\infty e^{-\frac{2t}{R_TC_0}} dt \\ &= 8.65 \text{ } [\mu J] \end{aligned} \quad (7)$$

Thus, in the case of the apparatus charging method as shown in FIG. 9, more current flows and less energy is absorbed by the resistor element R2, as compared with the body charging method as shown in FIG. 8, so that the resistor element R2 is not easily broken down. In addition, energy absorbed by the resistor element R2 when the resistance value $R_3$ of the resistor element R3 is extremely decreased is equal to the energy stored in a capacitor and has no relation with the resistance value. Thus, in order to decrease the maximum current, it is desirable that the resistance value $R_2$ of resistor element R2 is larger.

Since the relation $R_3 < < R_2$ is satisfied, current flowing to the ground terminal through the resistor element R3 is almost the same as the current I in the equation (6);

$$I \simeq (300/52) \cdot e^{-\frac{t}{R_TC_0}}$$

On the other hand, since $R_3$ equals 2[Ω], the energy $E_3$ absorbed by the resistor element R3 is as follows;

$$E_3 = R_3 \cdot \int_0^\infty I^2 dt = 0.346 [\mu J] \quad (8)$$

and the pulse width at the time of discharge of the RC circuit is as follows;

$$\text{pulse width} = 52 \times 200 \times 10^{-12}$$
$$\approx 10 \text{ [nsec]}$$

More specifically, the energy $W_3$ absorbed by the resistor element R3 per unit time is as follows;

$$W_3 = 0.346 \times 10^{-6}/10 \times 10^{-9}$$
$$= 34.6 \text{ [W]}$$

As shown in the graph (FIG. 10) of power density at which p-n junction is broken down, dangerous power density of junction breakdown is about $2 \times 10^3$ KW/cm² when the pulse width is about 10 nsec. In order to make power density of the diffusion layer less than $2 \times 10^3$ KW/cm², the diffusion area of 1700 μm² is required because the resistor element R3 is a field transistor.

Furthermore, when the resistance value $R_2$ of the resistor element R2 is 30 Ω, I is as follows;

$$I = (300/32) \cdot e^{-\frac{t}{R_TC_0}}$$

and thus, $I_{max} \simeq 10$[A], so that the current value is increased. Therefore, since $R_3$ equals 2[Ω], energy E absorbed by the resistor element R3 is as follows;

$$E_{30} = R_3 \cdot \int_0^\infty I^2 dt = 0.563 [\mu J] \quad (9)$$

Thus, the energy $E_{30}$ is increased. In addition, energy $W_{30}$ absorbed per unit time is as follows;

$$W_{30} = 0.563 \times 10^{-6}/10 \times 10^{-9}$$
$$= 56.3 \text{ [W]}$$

At that time, the pulse width is 6.4 nsec, and dangerous power density at the time of breakdown of p-n junction, which is obtained from FIG. 10, is about $2.5 \times 10^3$ KW/cm$^2$. In order to make power density of the diffusion layer less than $2.5 \times 10^3$ KW/cm$^2$, the diffusion area of about 2300 $\mu$m$^2$ is required.

Furthermore, when the resistance value $R_3$ of the resistor element R3 is smaller, consumed energy is smaller, so that it is desirable that the size of the contact and the size of the field transistor are increased.

As described in the foregoing, in the mode of the body charging method, when the resistance value $R_2$ of the resistor element R2 in the first stage of an input is small, a breakdown value of the resistor element R2 itself is high in the mode of the body charging method. However, if the resistance value $R_2$ is too small, too much current flows in the mode of the apparatus charging method, so that a p-n junction portion is broken down.

In consideration of the balance of a surge breakdown or resistance value with respect to each mode, the most suitable resistance value $R_2$ of the resistor element R2 is 30 to 50 $\Omega$. At that time, the condition of preventing heat melting of the resistor element R2 is hard in the case of the mode of the body charging method. In fact, in order to hold a breakdown voltage of at least 3000 [V], the heat capacity of the resistor element R2 of 1 to $2 \times 10^{-9}$ [cal/° C.] is required.

Additionally, from the point of view of decreasing current density, the resistor element R1 must have a width of more than 25 $\mu$m. The condition of breaking down p-n junction in the transistor Q4 is hard in the case of the mode of the apparatus charging method in which more current flows. When the resistor element $R_2$ equals 30[$\Omega$], the diffusion layer in a contact portion must have the total area of about 2300 $\mu$m$^2$ from the point of view of power density. In addition, in the field transistor, the insulating film is broken down except that the junction is broken down. Thus, in order to prevent an electric field from concentrating, edges of the contact portion and the field must be made an obtuse angle and edges of a field where a strain is liable to be produced in a process and the contact portion must be separated by about 5 $\mu$m. Furthermore, the area of the contact portion 111 of about 250 $\mu$m$^2$ is effective from the point of view of power density.

When the gate insulating film of the transistor Q3 is broken down, it is important to prevent the voltage of the gate electrode form increasing, so that a breakdown value is determined depending on the relation of the above described time constants $\tau_1$ and $\tau_2$ and the resistance value $R_1$ of the resistor element R1.

It is necessary to satisfy the relation $\tau_1 < < \tau_2$. However, assuming that the time period elapsed until the transistor Q4 is punched through, the relation $\tau_2 - \tau_1 > \tau_3$ must be satisfied.

Thus, not only the ratio of the resistance value $R_2$ of the resistor element R2 to the resistance value $R_1$ of the resistor element R2 but also the resistance value $R_1$ of the resistor element R1 being several hundreds $\Omega$, are necessarily required.

In such a structure, a breakdown value at a constant level can be ensured with respect to each surge mode.

Although in the above described embodiment, the second resistor element R2 has a two-layer structure shown in FIG. 11, comprising polysilicon and a refractory metal, the second resistor element R2 may be formed of polysilicon having the same heat capacity and the resistance value, in which case the same effect can be obtained. For example, the second resistor element R2 may be formed of a stripe-like polysilicon layer having a width of more than 50 $\mu$m.

Furthermore, even if the second resistor element R2 is formed of diffusion resistance, the same effect can be obtained. In this case, p-n junction is broken down, so that the diffusion area of the contact portion must be increased. For example, the second resistor element R2 must be formed of the stripe-like diffusion resistance having a width of more than 50 $\mu$m, and the area of a contact portion with the interconnection layer must be more than 300 $\mu$m$^2$.

Although in an input protective apparatus according to the above described embodiment, the gate electrode of the transistor Q4 is connected to the ground terminal, the transistor Q4 functions only as a punch through, so that the gate electrode may be connected to an input pad or removed, in which case the same effect can be obtained.

As described in the foregoing, according to the present invention, since breakdown modes of a surge pulse caused by static electricity are considered and each resistor element and the MOS type transistor are optimized, an input protective apparatus uniformly immune to various surge pulses can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input protective apparatus for a semiconductor device (Q3), comprising an MOS transistor (Q4) having one active layer connected through a first resistor element (R1) to an input node of said device (Q3) and another active layer connected to a ground terminal of said device, a gate of said MOS transistor formed with a thick oxide insulating film, which further comprises an external terminal (11) receiving an input signal to be applied to the input node of said semiconductor device (Q3) and a second resistor element (R2) connected between said external terminal (110 and one of the active layers of said MOS transistor (Q4), a resistance value $R_1$ of said first resistor element (R1) and a resistance value $R_2$ of said second resistor element (R2) having the relation $R_1 > R_2$, and said MOS type transistor being formed such that an on-resistance $R_3$ thereof satisfies a relation $R_3 < < R_2$.

2. An input protective apparatus as recited in claim 1 wherein said second resistor element is formed of a double layer structure, including polysilicon and a refractory metal.

3. An input protective device as recited in claim 1, wherein the resistance value of said second resistor element is several tens ohm.

4. An input protective device as recited in claim 3 wherein the resistance value of said second resistor element is in the range of 30 to 50 ohms.

5. An input protective device as recited in claim 3 wherein the resistance value of said first resistor element is several 100 ohms.

6. An input protective device as recited in claim 5 wherein said on-resistance $R_3$ is several ohms.

7. An input protective device as recited in claim 3 wherein said on-resistance $R_3$ is several ohms.

8. An input protective apparatus for a semiconductor device as recited in claim 1, wherein
said MOS type transistor ($Q^4$) has a gate oxide film formed by selectively oxidizing a region between active layers (111, 112) serving as a source and a drain each formed on a semiconductor substrate, so that a length of said active layers along said gate oxide film is more than 100 $\mu$m, spacing between said active layers is less than 2 $\mu$m, and the on-resistance is several $\Omega$, wherein the resistance value $R_1$ of said first resistor element (R1) is several hundreds $\Omega$ and the resistance value $R_2$ of said second resistor element (R2) is about 30 to 50 $\Omega$.

9. An input protective apparatus for a semiconductor device as recited in claim 1, wherein
a total area of one of said active layers of said MOS type transistor ($Q^4$) is more than 2500 $\mu$m$^2$, an area of a contact region between one of said active layers and an interconnection layer is more than 300 $\mu$m$^2$, and spacing between edges of said contact region and said active layer is more than 5 $\mu$m.

10. An input protective apparatus for a semiconductor device as recited in claim 1, wherein
said second resistor element (R2) is formed of a stripe-like polysilicon layer having a width of more than 50 $\mu$m, an area of a contact region between a first interconnection layer and said second resistor element (R2) is more than 250 $\mu$m$^2$, said first interconnection layer connecting said second resistor element (R2) to said input terminal (11), and an area of a contact region between a second interconnection layer and said second resistor element is more than 250 $\mu$m$^2$, said second interconnection layer connecting said second resistor element to one of the active layers of said MOS type transistor (Q3).

11. An input protective apparatus for a semiconductor device as recited in claim 1, wherein
said second resistor element (R2) is formed of a stripe-like film having a two-layer structure comprising polysilicon and a refractory metal and having a width of more than 25 $\mu$m, and an area of a contact region between a first interconnection layer and said second resistor element (R2) is more than 250 $\mu$m$^2$, said first interconnection layer connecting said second resistor element (R2) to said input terminal (101), and an area of a contact region between a second interconnection layer and said second resistor element is more than 250 $\mu$m$^2$, said second interconnection layer connecting said second resistor element to one of the active layers of said MOS type transistor (Q3).

12. An input protective apparatus for a semiconductor device as recited in claim 1, wherein
said second resistor element (R2) is diffusion resistance comprising a stripe-like diffusion layer having a width of more than 50 $\mu$m, an area of a contact region between a first interconnection layer an said second resistor element (R2) is more than 250 $\mu$m$^2$, said first interconnection layer connecting said second resistor element (R2) to said input terminal, and an area of a contact region between a second interconnection layer and said second resistor element is more than 300 $\mu$m$^2$, said second interconnection layer connecting said second resistor element to one of the active layers of said MOS type transistor, and the spacing between peripheral portions of each of said contact regions and said active layer (111) is more than 5$\mu$m.

13. An input protective apparatus for a semiconductor device in accordance with claim 1 wherein said relationships between resistance values is selected to establish time constants for discharging surge pulses from an external source.

14. An input protective apparatus as recited in claim 10 wherein said contact areas, width and spacing, and said resistance values, are selected to establish time constants for discharging surge pulses from an external source.

15. An input protective apparatus for a semiconductor device (Q3), comprising an MOS transistor (Q4) having one active layer connected through a first resistor element (R1) to an input node of said device (Q3) and another active layer connected to a ground terminal of said device, a gate of said MOS transistor formed with a thick oxide insulating film and connected to said ground terminal,
which further comprises an external terminal (11) receiving an input signal to be applied to the input node of said semiconductor device (Q3) and a second resistor element (R2) connected between said external terminal (11) and one of the active layers of said MOS transistor (Q4),
a resistance value $R_1$ of said first resistor element (R1) and a resistance value $R_2$ of said second resistor element (R2) having the relation $R_1 > R_2$, and said MOS type transistor being formed such that an on-resistance $R_3$ thereof satisfies a relation $R_3 < < R_2$.

16. An input protective apparatus as recited in claim 1 wherein $t_3$ designates a time period required for punch through of said MOS transistor (Q4), $t_2$ designates a propagation time to said semiconductor device (Q3) to be protected of a pulse appearing at said external terminal (11) and $t_1$ designates a propagation time to ground of a pulse applied to said external terminal (11), wherein said resistance values are selected to establish a relationship $t_2 - t_1 > t_3$.

17. An input protective apparatus as recited in claim 16 wherein said relationship between said values of said first and second resistance values is such as to establish a relationship between $t_1$ and $t_2$ wherein $t_2 > > t_1$.

18. An input protective apparatus as recited in claim 13 wherein said relationships between said resistance values is such as to establish a relationship between said time constants wherein $t_2 > > t_1$,
where $t_2$ designates a propagation time to said semiconductor device (Q3) to be protected of a pulse appearing at said external terminal (11) and $t_1$ designates a propagation time to ground of a pulse applied to said external terminal (11).

19. An input protective apparatus as recited in claim 18 wherein said relationships between said resistance values is such as to establish a relationship between said time constants wherein $t_2 - t_1 > t_3$,
wherein $t_3$ designates a time period required for punch through of said MOS transistor (Q4).

* * * * *